United States Patent [19]
Salli et al.

[11] Patent Number: 5,932,013
[45] Date of Patent: Aug. 3, 1999

[54] APPARATUS FOR CLEANING A SEMICONDUCTOR PROCESSING TOOL

[75] Inventors: Carlyle F. Salli; Andrew J. Phebus, both of Round Rock, Tex.

[73] Assignee: Advanced Micro Devices, Inc.

[21] Appl. No.: 08/842,178

[22] Filed: Apr. 23, 1997

[51] Int. Cl.⁶ .............................. C23C 16/00; B08B 5/04
[52] U.S. Cl. .............................. 118/715; 134/21; 134/37; 15/415.1; 15/300.1
[58] Field of Search .............................. 118/715; 134/21, 134/37; 15/300.1, 415.1, 394, 395, 310

[56] References Cited

U.S. PATENT DOCUMENTS

| | | | |
|---|---|---|---|
| 3,216,043 | 11/1965 | Lipson | 15/310 |
| 4,787,118 | 11/1988 | Weiland et al. | 15/394 |
| 5,330,577 | 7/1994 | Maeda et al. | 118/722 |
| 5,359,751 | 11/1994 | Bellardini | 15/394 |
| 5,746,834 | 5/1998 | Hanley | 118/715 |

*Primary Examiner*—Bruce Breneman
*Assistant Examiner*—Jeffrie Lund
*Attorney, Agent, or Firm*—Kevin L. Daffer; Conley, Rose & Tayon

[57] ABSTRACT

A method and apparatus for cleaning apertures within an input manifold of a semiconductor fabrication deposition tool is presented. Vapor phase chemicals that contain the required constituents are introduced into the tool through the input manifold. The apertures of the input manifold direct the gas flow towards the surface of the wafer where they are absorbed and react to form thin films. Film accumulates on the wafers but also in other places inside the chamber of the reactor. Those places include the sidewall surfaces of the gas delivery apertures. Apertures deposits can source contaminants thereby causing defects on the wafers. The presented cleaning mechanism is operably sealed to the input manifold on one end and to a vacuum pump at the other end. The vacuum cleaner comprises a rotating plate with a radial slot. Air flows from the input manifold, through the apertures, through the slot, and to the vacuum pump. Air flows is directed with increased flow rate and pressure through the slot having purposefully smaller dimensions than the summation of all apertures within the input manifold. Specifically, the slot overlies only a subset of all apertures to force a greater amount of air through the apertures currently being cleaned. The slot rotates to sequentially expose all of the apertures to the higher velocity airflow but at different times to complete the cleaning process.

19 Claims, 2 Drawing Sheets

APPARATUS FOR CLEANING A SEMICONDUCTOR PROCESSING TOOL

BACKGROUND OF THE INVENTION

1. Field of the Invention

This invention relates to semiconductor processing tools and, more particularly, to an apparatus for cleaning dispersing apertures configured within an input manifold of a deposition tool. The apparatus includes a rotating arm containing a vacuum source for drawing from the apertures deposits residing therein.

2. Description of Relevant Art

Most non-volatile solid films on a semiconductor substrate are formed by chemical-vapor deposition ("CVD"). Vapor phase chemicals that contain the required constituents react to form the solid films upon the substrate. A wide variety of amorphous or polycrystalline thin films may be deposited by CVD.

As a first step, reactant gases at a certain flow rate are introduced into a reactor. The gas species then move towards the substrate where they are absorbed and undergo migration and film-forming chemical reactions. Any remaining byproducts are then removed from the reactor. The chemical reactions that form the films nay take place not only on (or near) the wafer surface but also in the gas phase above the wafer surface.

CVD reactors are generally open-flow systems, in which gases continuously flow into the reactors, and gaseous byproducts are exhausted together with unused reactants and carriers. Reactant gases are typically carried by carrier gases such as hydrogen, nitrogen, or argon. Corrosive and hazardous gases pumped from the reactor are removed from the exhaust gas flow by a scrubber, and the scrubber output is then vented to the atmosphere. The input of the gases is controlled by mass-flow controllers and byproducts are removed from the reactor by a vacuum pump.

The design and operation of CVD reactors depends on a variety of factors, and hence they can be categorized in several ways. The first distinction between reactor types is whether they are hot-wall or cold-wall reactors, which depends on the method used to heat the wafers. The next criterion is their pressure regime of operation. The reactors can operate at atmospheric pressure, termed atmospheric-pressure CVDs (APCVDs) or operate at reduced pressure, termed low-pressure CVDs (LPCVDs). LPCVDs are further categorized into those where the energy input is entirely thermal and to those where the energy is partially supplied by a plasma, generally known as plasma-enhanced CVDs (PECVDs).

An example of a CVD reactor is shown in FIG. 1. Wafer 10 is placed upon wafer staging platform 12 inside chamber 21. Platform 12 is secured relative to housing 14 which surrounds the reactor. Housing 14 is removable to enable cleaning of the inside surface of chamber 21. Housing 14 attaches to the upper portion of the reactor via flanges 16 and 18 which engage with receptors 20 and 22. Receptors 20 and 22 are attached to the upper portion of the reactor. The reactant gases, which contain the necessary constituents to form the thin films, are introduced into the reactor through input manifold 24. Input manifold 24 comprises an input port terminating into a manifold which has, at one end of the manifold, a plate 26. Circular plate 26 comprises a plurality of apertures which are responsible of directing or dispensing reactant gases 28 delivered from the input port across the upper surface of wafer 10. Any unreacted gases and byproducts of the reaction are removed from chamber 21 through output manifold 30. Output manifold 30 is brought in communication with chamber 21 near the backside surface of platform 12, to evacuate byproducts as they pass from the plasma, reaction phase. A vacuum pump is attached (not shown) to manifold 30 to drawn byproducts from chamber 21. In the case of LPCVD reactors, the vacuum pump is also responsible for maintaining the chamber below atmospheric pressure.

CVD reactors can be used to deposit, for example, polysilicon, silicon dioxide (which may be formed from several different reactant gases), silicon nitride, phosphosilicate glass, and borophosphosilicate glass. Examples of reactant gases used in CVD reactors are silane, nitrous oxide, TEOS, TMP, TMB, oxygen, nitrogen, phosphine, and diborane. After several runs of the equipment, the deposition film accumulates on the sidewalls of the reactor and along the sidewall surfaces of the dispersing apertures periodically spaced through the input manifold. Eventually, cleaning of the apertures becomes essential in order to ensure proper flow of the reactant gases out of the input manifold. Accumulation on the dispersing apertures not only may clog those apertures, but can also be a source of contaminants which can deleterious fall onto the wafer surface.

Conventional cleaning of the apertures within plate 26 involves; manually wiping away accumulation with a cloth. Cleaning the plate using this method can spread the deposits from the apertures into the rest of the chamber thereby sourcing additional defect-arising sites. In addition, some of the deposits are pushed back through the apertures into input manifold 24 where they reside until gas flow is resumed. The particulate material becomes entrained within the gas flow and eventually falls upon the wafer. It would thus be desirable to employ a mechanism which can more effectively clean accumulated materials (i.e., particulate, film, debris, contaminant, etc.) from the input manifold plate. It would likewise be desirable to contain the removed material to prevent it from spreading elsewhere inside the reactor.

SUMMARY OF THE INVENTION

The problems identified above are in large part addressed by a rotating vacuum cleaner. The cleaner sealingly attaches to a circular plate at the end of the reactor input manifold. A vacuum pump attached to the cleaner creates an airflow through the input manifold as well as through the dispersing apertures associated with the input manifold. The airflow removes the deposits accumulated from the aperture, or aperture sidewall surfaces. The deposits are contained within a filter inside the vacuum pump. In addition, the airflow through the apertures is restricted to a smaller area than the total area of the plate of the input manifold through the use of rotating radial slot. By limiting the area of the flow, higher airflow velocities can be accomplished which can more effectively remove the accumulated deposits from the dispersing apertures. By rotating the radial slot, all the apertures are sequentially exposed to the airflow. This method and equipment associated therewith effectively remove the deposits and contain the removed deposit at a site remote from the input manifold.

Broadly speaking, the present invention contemplates an apparatus for cleaning a semiconductor processing tool. The semiconductor processing tool is a reactor comprising a gas input manifold, a gas output manifold, and a wafer platform. The input manifold terminates at a circular plate which comprises a plurality of apertures responsible for directing a gas towards the wafer platform. Deposits arising from previous deposition cycles may accumulate on and constrict apertures used for dispersing a deposition source material forwarded through the input manifold. The cleaning apparatus comprises a cylindrical shell placeable over the circular plate so that an upper portion of the inner surface of the shell is configured to sealingly abut a perimeter of the plate. A lower portion of the shell comprises a first groove. A first plurality of ball-bearings is partially housed within the first groove.

A circular disk with a radial slot is placed within and against the lower portion of the inner surface of the shell. The circular disk comprises an outer surface with a second groove. The disk is arranged so that the second groove opposes the first groove to substantially encircle the first plurality of ball-bearings in order to enable the disk to rotate relative to the shell. A slot extends through the disk and rotates relative to the rotatable disk. A portion of the apertures are located directly above the slot at any given instant of time. The number of apertures above the slot are brought in gaseous communication with a vacuum delivered through the slot via the cleaning mechanism vacuum supply.

A lower-side cover is placed on the disk and is sealingly attached over the slot. The cover comprises a pipe receptor with a third groove around an inner surface of the pipe receptor. The cover is configured to be in gaseous communication with the slot. A second plurality of ball-bearings is partially housed within the third groove. A pipe, with a fourth groove around an outer surface of the pipe, is placed into the pipe receptor such that the fourth groove opposes the third groove on opposite sides of the second plurality of ball-bearings. The third and fourth grooves substantially surround the second plurality of ball-bearings in order to allow the pipe to rotate relative to the pipe receptor. The pipe is in gaseous communication with the pipe receptor. A hose is attached to the pipe on one end and to a vacuum pump on the other end. The hose is in gaseous communication with both the pipe and the vacuum pump.

The cylindrical shell, circular disk, lower side cover, and pipe comprise aluminum. In addition, the cylindrical shell comprises a handle for holding the shell up against the plate. The radial slot extends from a center of the disk to a perimeter of the disk. Another pipe may be sealingly connected between, and in gaseous communication with, the pipe and the hose. The additional pipe may comprise a relief valve that can be pressed to release the pressure inside the pipe.

The present invention further contemplates a method for cleaning a semiconductor processing tool. A reactor is provided with a circular input manifold which terminates in a plurality of apertures. The apertures comprise an accumulated deposit around a perimeter of the apertures. A housing of the reactor is first removed and a vacuum cleaner is sealingly placed over the circular manifold. The vacuum cleaner comprises a rotating vacuum slot that, at any instant in time, is in gaseous communication with a portion of the plurality of apertures. This portion of plurality of apertures is located directly above the slot and has an area which is approximately equal to an area of the slot.

A vacuum pump is sealingly attached to a lower portion of the rotating vacuum slot. The vacuum pump creates a flow of air from the manifold, through the portion of plurality of apertures, through the slot, and to the vacuum pump. Subsequently, the slot is rotated whereby the accumulated deposit from around a perimeter of the portion of the plurality of apertures is removed.

The vacuum cleaner is held in place by an operator who holds up the vacuum cleaner from a handle attached to the vacuum cleaner. The vacuum cleaner may comprise a relief valve for temporarily releasing the vacuum pressure from inside the vacuum cleaner. The air flows through the slot with a velocity which is approximately 25 times higher than a velocity of air flowing through the manifold.

BRIEF DESCRIPTION OF THE DRAWINGS

Other objects and advantages of the invention will become apparent upon reading the following detailed description and upon reference to the accompanying drawings in which.

Figure 1:
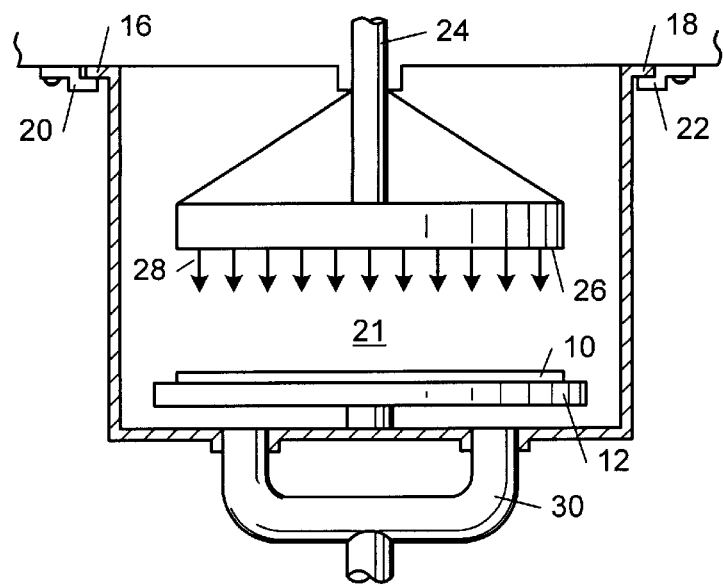
FIG. 1 is a cross-sectional view of a CVD reactor showing an input and an output manifold and a wafer platform with a wafer resting upon the platform.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE
PREFERRED EMBODIMENTS

Figure 2:
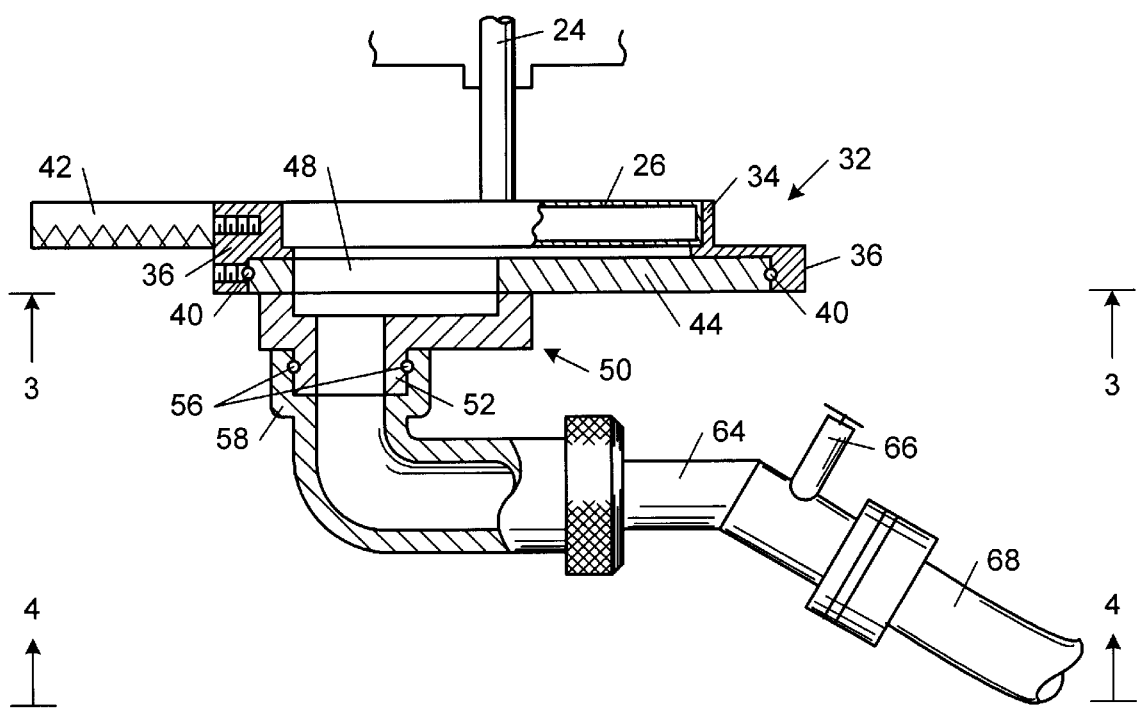
FIG. 2 is a partial cross-sectional view of a vacuum-assisted cleaning device attachable to an aperture-bearing manifold plate of an input manifold for removing deposits within the aperture.

Turning now to the drawings, FIG. 2 is a cross-sectional view of input manifold 24 of a reactor chamber, preferably a CVD reactor chamber. The manifold of input manifold 24 terminates at circular plate 26 which comprises a plurality of apertures responsible for directing a gas that comes through input manifold 24 toward the wafer platform inside the reactor. The proposed vacuum cleaner is shown attached to circular plate 26.

The vacuum cleaner comprises cylindrical shell 32 partitioned into an upper portion 34 and a lower portion 36. The upper portion 34 has an inner surface of configured to sealingly abut a perimeter of circular disk 44. The inward facing surface of the lower portion 36 comprises a groove which extends around the entire inward facing surface. The groove within portion 36 partially houses ball-bearings 40. Handle 42 is attached to the outer surface of cylindrical shell 32 to enable an operator to hold the vacuum cleaner against plate 26 during a cleaning cycle.

Circular disk 44 is placed inside circular shell 32 such that an upper surface, near the perimeter of the disk rests against a lower portion 36 which extends downward toward the disk. Circular disk 44 is brought a spaced distance from plate 26. An outer peripheral, lateral surface of circular disk 44 comprises a groove which is arranged in such a way as to also partially house ball-bearings 40. Ball-bearings 40 hold circular disk 44 in place and also allow circular disk 44 to rotate relative to cylindrical shell 32. Circular disk 44 additionally comprises an opening (or slot) 48 which extends through a portion of disk 44 from the center of the disk toward the perimeter of the disk. Slot 48 is therefore radially shaped, and allows air to flow through the slot from the top side of the disk to the bottom side of disk.

Lower-side cover 50 is attached to the bottom side of circular disk 44 and is configured to completely cover slot 48. At the bottom side, cover 50 extends downward and terminates as a pipe receptor 52. Cover 50 is spaced slightly from a portion of the slot to allow air to flow from radial slot 48 through the cover and out through pipe receptor 52. The outer surface of pipe receptor 52 is encircled with a groove. The groove within pipe receptor 52 partially houses a plurality of ball-bearings 56 which encircle the pipe receptor, between receptor 52 and a pipe 58.

Pipe 58 is placeable over the lower portion of cover 50, and specifically over pipe receptor 52. An inner surface of pipe 58 comprises a groove which opposes the groove within pipe receptor 52, whereby the combination of opposing groove,; house ball-bearings 56. Ball-bearings 56 secure pipe 58 in place and also allow pipe 58 to rotate relative to pipe receptor 52. Pipe 58 may additionally comprises a bend to extend the pipe in the horizontal direction. One end of hose 68 is connected to pipe 58 and the other end to a vacuum pump (not shown). The vacuum pump is responsible for creating a strong airflow through the vacuum cleaner and through the apertures of plate 26. More detail on the operation of the vacuum cleaner follows. In a preferred embodiment, pipe attachment 64 may be inserted between pipe 58 and hose 68. Pipe attachment 64 comprises a relief valve 66 which can be used to temporarily release the vacuum in the system. This is required to ensure smooth engagement and disengagement of the vacuum cleaner to plate 26. Due to the presence of a strong vacuum, engagement without pressing the relief valve would be very abrupt and disengagement would require excessive force.

Figure 3:
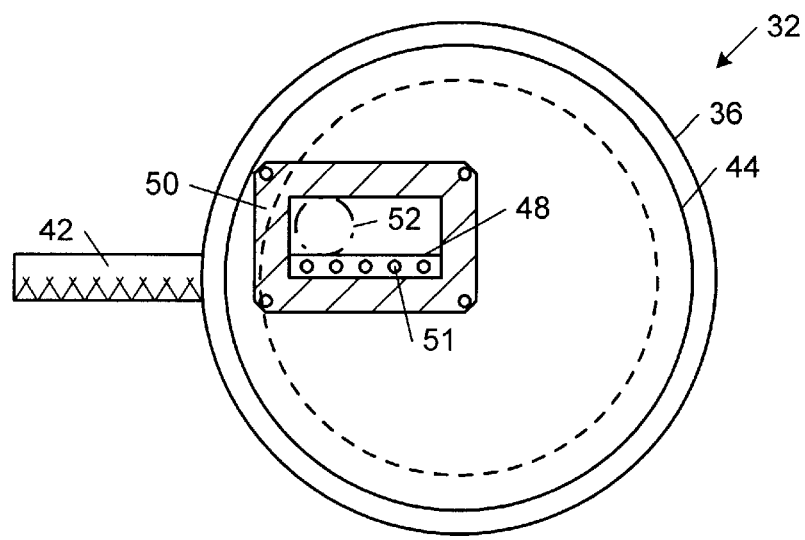
FIG. 3 is a bottom, partial breakaway view of the cleaning device of FIG. 2, more clearly showing a slot within a rotating disk and a plurality of apertures aligned above the slot through which a vacuum-delivered air flow is delivered.

FIG. 3 is a bottom, partial breakaway view of the vacuum delivery mechanism hereof. FIG. 3 illustrates cylindrical shell 32 and a handle 42 attached to and extending from the cylindrical shell. Specific illustration is to the lower portion 36 of shell 32. The upper portion being hidden from view by disk 44. Disk 44 rotates within portion 36, and only an outer portion of disk 44 upper surface abuts against an outer portion lower surface (i.e., flange) of shell 32 (shown in FIG. 2). The dotted circular line represents rotation of disk 44 within lower portion 36. The bottom view of FIG. 3 indicates slot 48 extending from the center to approximately the perimeter of circular disk 44. Cover 50 is removed to expose slot 48 and a set of apertures 51 aligned with the slot at a particular moment in time. The outline of cover 50 circumventing a portion of plate 44 indicates a relationship between pipe receptacle 52, slot 48 and apertures 51. Once cover 50 is in place, air flow directed from receptacle 52 traverses slot 48 and, more importantly, apertures 51 aligned with the slot to draw loosely bound particulate matter (i.e., unwanted deposits) from the inside diameter of apertures. Cover 50 is purposefully dimensioned large enough to encompass radial slot 48 as well as pipe receptor 52.

When it is determined that the apertures of plate 26 require cleaning, housing 14 of the reactor is first removed to expose input manifold 24 and, more specifically the downward facing side of plate 26 and the apertures 51 contained therein. An operator then connects hose 68 to a vacuum pump and places the vacuum delivery device over circular plate 26 using handle 42. While this is performed, relief valve 66 should be remain pushed in (open position) in order to decrease the vacuum pressure as seen by the pipe receptacle 50 upon plate 26. Decreasing the vacuum pressure ensures smooth engagement (and easier disengagement) to and from plate 26. After engagement the valve should be released (closed position).

Figure 4:
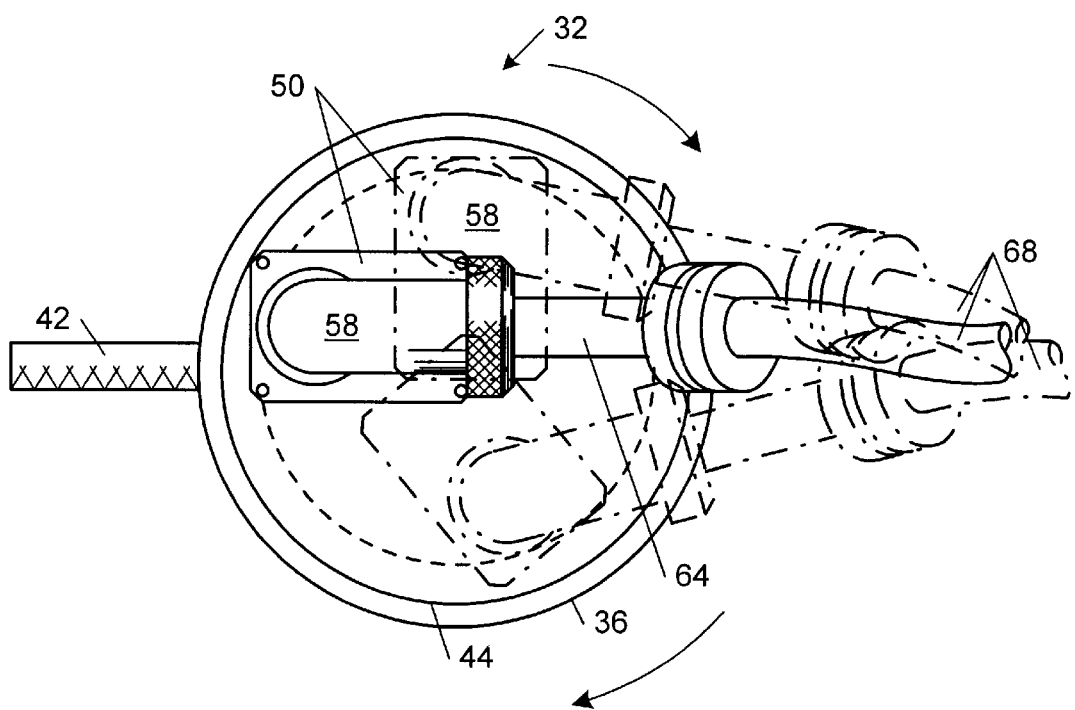
FIG. 4 is a bottom view of the cleaning device of FIG. 2, more clearly showing rotation of a vacuum-delivery pipe within a pipe receptacle and the rotating disk within a shell attached to the input manifold for allowing reciprocal movement of a vacuum source across all apertures associated with the manifold plate.

As mentioned above, circular disk 44 is free to rotate with respect to cylindrical shell 32, and pipe 58 is free to rotate with respect to circular disk 44. An operator can hold the vacuum delivery device against circular plate 26 and then rotate pipe 58 either clockwise or counter-clockwise. Since circular disk 44 is free to rotate, pipe 58 can remain pointing in approximately the same direction during the rotation which can prevent tangling of hose 68. FIG. 4 shows this rotation. Cylindrical shell 32 with handle 42 are held stationary, circular disk 44 undergoes rotation, and pipe 58 rotates with circular disk 44 while extending along approximately the same axis during co-rotation of both pipe 58 and disk 44.

While circular disk 44 rotates, radial slot 48 also rotates with respect to circular plate 26, at any instant in time, exposing a set of apertures of circular plate to the vacuum delivery system, i.e., airflow. The area of the exposed portion of the apertures is approximately equal to the area of the radial slot. As the radial slot rotates, all the apertures in circular plate 26 are sequentially exposed to the airflow. Having a slot with a small area (smaller than the area of circular plate 26) results in an increase of the airflow through the select set of apertures. Airflow enhancement in accordance with the present "select" delivery system results in a more effective force delivery to the deposit accumulated on the surface of the apertures selected by slot 48. According to the equation of continuity for fluids:

$$\rho A v = constant,$$

where $\rho$ is the density of the fluid, A is the area that the fluid flows through, and $v$ is the velocity of the flow. According to the above equation, the velocity of the airflow is inversely proportional to the area that the fluid is flowing through. In a preferred embodiment, the area of circular plate 26 is approximately 33.2 in$^2$ and the area of radial slot 48 is approximately 1.3 in$^2$. That is, the velocity of the air through the apertures of circular plate 26 with the radial slot in place is approximately 25 times the velocity of the air through the apertures of circular plate 26 without the radial slot.

It will be appreciated to those skilled in the art having the benefit of this disclosure that this invention is believed to be capable of faster and more effective cleaning of the apertures of an input manifold of a CVD reactor. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. An apparatus for cleaning a plurality of apertures extending through a gas delivery manifold of a semiconductor processing tool, comprising:

a cylindrical shell adapted for attachment to a plate of the gas delivery manifold bearing said plurality of apertures;

a disk adapted for rotation within the cylindrical shell, wherein the disk includes a slot extending through a portion of the disk over a first subset of said plurality of apertures; and a vacuum delivery device coupled over said slot for drawing an air flow through the first subset of said plurality of apertures to extract deposits contained therein.

2. The apparatus as recited in claim 1, wherein said disk is rotated within the cylindrical shell such that the slot extends over a second subset of said plurality of apertures dissimilar from the first subset.

3. The apparatus as recited in claim 1, further comprising a plurality of ball bearings housed between an outer periphery of the disk and an inner surface of the cylindrical shell to effectuate, during use, rotation of the disk within the cylindrical shell.

4. The apparatus as recited in claim 3, wherein the plurality of ball bearings are housed within grooves formed in the outer periphery of the disk and the inner surface of the cylindrical shell.

5. The apparatus as recited in claim 1, wherein the cylindrical shell is sealingly attached to the plate during use.

6. The apparatus as recited in claim 1, wherein said slot is contained in fluid communication with a cover which draws the air flow of said vacuum delivery device exclusively through the first subset of said plurality of apertures.

7. The apparatus as recited in claim 6, wherein said cover comprise aluminum.

8. The apparatus as recited in claim 1, further comprising a pipe receptacle configured to direct said air flow between the slot and a pipe connected to the vacuum delivery device.

9. The apparatus as recited in claim 8, wherein the pipe is rotatably connected to the pipe receptacle by a plurality of ball bearings housed between an outer periphery of the pipe and an inner surface of the pipe receptacle.

10. The apparatus as recited in claim 9, wherein the plurality of ball bearings are housed within grooves formed in the outer periphery of the pipe and the inner surface of the pipe receptacle.

11. The apparatus as recited in claim 10, wherein said cylindrical shell, said disk and said pipe comprise aluminum.

12. The apparatus as recited in claim 8, wherein another pipe is adapted for connection to the pipe, and wherein said another pipe comprises a relief valve for releasing pressure inside said pipe during attachment of the cylindrical shell to the plate.

13. The apparatus as recited in claim 1, wherein said cylindrical shell comprises a handle extending from the cylindrical shell for holding said cylindrical shell against said plate during attachment thereto.

14. The apparatus as recited in claim 1, wherein said radial slot extends from a center of said disk to a perimeter of said disk.

15. A semiconductor process tool cleaning system, comprising:

a semiconductor tool gas delivery manifold comprising a plate having a plurality of apertures containing an accumulation of deposits therein;

a cleaning device sealingly abutting an outer perimeter of said plate, wherein said cleaning device comprises a slot which rotates a spaced distance from a surface of said plate proximate to a subset of said plurality of apertures; and a vacuum supply directed through said slot for extracting an air flow through said subset of apertures and into the vacuum supply.

16. The system as recited in claim 15, wherein said cleaning device comprises a shell secured to the plate and a disk encompassing the slot rotatable within the shell.

17. The system as recited in claim 15, wherein said vacuum supply comprises a pipe receptacle pivotably secured to the disk and a vacuum supply pipe rotatably secured to the pipe receptacle.

18. A method for cleaning a semiconductor processing tool, comprising:

providing a reactor with an input manifold, wherein said manifold terminates in a plurality of apertures and wherein said apertures comprise deposits within the apertures;

attaching a vacuum delivery device to said manifold, wherein said vacuum delivery device comprises a rotating slot, wherein said rotating slot is, at any instant in time, in gaseous communication with a subset of said plurality of apertures, and wherein the subset of apertures are located a spaced distance from and, in fluid communication with, said slot;

forwarding a flow of air through the subset of apertures to a vacuum pump; and rotating said slot with respect to said manifold to align the slot with another subset of apertures and repeating the step of forwarding a flow of air to said another subset of apertures.

19. The method as recited in claim 18, wherein the step of attaching comprises lifting the vacuum delivery device against said manifold using a handle attached to said vacuum delivery device.

* * * * *